US008624682B2

(12) United States Patent
Ridley et al.

(10) Patent No.: US 8,624,682 B2
(45) Date of Patent: Jan. 7, 2014

(54) VAPOR CELL ATOMIC CLOCK PHYSICS PACKAGE

(75) Inventors: Jeff A. Ridley, Shorewood, MN (US); Robert Compton, Plymouth, MN (US); Mary K. Salit, Plymouth, MN (US); Jeffrey Kriz, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 145 days.

(21) Appl. No.: 13/327,417

(22) Filed: Dec. 15, 2011

(65) Prior Publication Data

US 2012/0313717 A1 Dec. 13, 2012

Related U.S. Application Data

(60) Provisional application No. 61/496,517, filed on Jun. 13, 2011.

(51) Int. Cl.
*H03B 17/00* (2006.01)
*H05K 13/04* (2006.01)

(52) U.S. Cl.
USPC ................................ 331/94.1; 331/3; 29/825

(58) Field of Classification Search
USPC ....................................... 331/94.1, 3; 29/825
See application file for complete search history.

(56) References Cited

U.S. PATENT DOCUMENTS 5,614,708 A 3/1997 Koishi et al.
5,644,353 A 7/1997 Sarraf
5,656,189 A 8/1997 Crockett et al.
5,818,626 A 10/1998 Engstrom et al.
6,108,025 A 8/2000 Li et al.
6,265,945 B1 7/2001 Delaney et al.
6,570,459 B1 5/2003 Nathanson et al.
6,888,780 B2 5/2005 Happer et al.
6,927,636 B2 8/2005 Deng et al.

(Continued)

FOREIGN PATENT DOCUMENTS

EP 0622905 11/1994
WO 9712298 4/1997
WO 0043842 7/2000

OTHER PUBLICATIONS

Chung et al., "Spectral Characteristics of Vertical-Cavity Surface-Emitting Lasers With External Optical Feedback", "IEEE Photonics Technology Letters", Jul. 1991, pp. 597-599, vol. 3, No. 7, Publisher: IEEE.

(Continued)

*Primary Examiner* — Joseph Chang
(74) *Attorney, Agent, or Firm* — Fogg & Powers LLC

(57) ABSTRACT

In an example, a chip-scale atomic clock physics package is provided. This chip-scale atomic clock physics package includes a body defining a cavity, and a first scaffold mounted in the cavity. A laser is mounted on the first surface of the first scaffold. A second scaffold is also mounted in the cavity. The second scaffold is disposed such that the first surface of the second scaffold is facing the first scaffold. A first photodetector is mounted on the first surface of the second scaffold. A vapor cell is mounted on the first surface of the second scaffold. A waveplate is also included, wherein the laser, waveplate, first photodetector, and vapor cell are disposed such that a beam from the laser can propagate through the waveplate and the vapor cell and be detected by the first photodetector. A lid is also included for covering the cavity.

20 Claims, 5 Drawing Sheets

(56) References Cited

U.S. PATENT DOCUMENTS

| | | | |
|---|---|---|---|
| 7,215,213 B2 | 5/2007 | Mescher et al. | |
| 7,323,941 B1 | 1/2008 | Happer et al. | |
| 7,468,637 B2 | 12/2008 | Braun et al. | |
| 8,031,010 B1 | 10/2011 | Berquist et al. | |
| 8,242,851 B2 * | 8/2012 | Youngner et al. | 331/94.1 |
| 2005/0062552 A1 | 3/2005 | Deng et al. | |
| 2006/0022761 A1 | 2/2006 | Abeles et al. | |
| 2006/0139029 A1 | 6/2006 | Abbink et al. | |
| 2007/0188075 A1 | 8/2007 | Kimiya et al. | |
| 2007/0247241 A1 | 10/2007 | Braun et al. | |
| 2008/0225907 A1 | 9/2008 | Diels et al. | |
| 2009/0066430 A1 | 3/2009 | Braun et al. | |
| 2011/0031969 A1 | 2/2011 | Kitching et al. | |
| 2011/0128082 A1 | 6/2011 | Maki et al. | |
| 2011/0187464 A1 | 8/2011 | Youngner et al. | |
| 2011/0187465 A1 | 8/2011 | Youngner et al. | |
| 2011/0187466 A1 | 8/2011 | Youngner et al. | |
| 2011/0188524 A1 | 8/2011 | Youngner et al. | |
| 2011/0189429 A1 | 8/2011 | Youngner et al. | |

OTHER PUBLICATIONS

Lutwak, et al., "The Chip-Scale Atomic Clock—Coherent Population Trapping Vs. Conventional Interrogation", "34th Annual Precise Time and Time Interval (PTTI) Meeting", 2003, pp. 539-550, Publisher: Symmetricom—Technology Realization Center, Published in: Beverly, MA, USA.

"New Technology Enables a Chip Scale Atomic Clock", Jan. 2011, pp. i-5, Publisher: Symmetricom.

European Patent Office, "European Search Report", "from Foreign Counterpart of U.S. Appl. No. 13/327,417", Nov. 16, 2012, pp. 1-7, Published in: EP.

European Patent Office, "Office Action", "from Foreign Counterpart of U.S. Appl. No. 13/327,417", May 13, 2013, pp. 1-8, Published in: EP.

European Patent Office, "Partial European Search Report", mailed Jul. 27, 2012, Published in: EP.

Lutwak et al., "The Miniature Atomic Clock—Pre-Production Results", May 1, 2007, pp. 1-7.

Schweber, "Chip-scale atomic clock approaches performance of modules", Jan. 18, 2011, pp. 1-3.

* cited by examiner

VAPOR CELL ATOMIC CLOCK PHYSICS PACKAGE

CROSS-REFERENCE TO RELATED APPLICATIONS

This application claims the benefit of priority to U.S. Provisional Application No. 61/496,517, filed on Jun. 13, 2011, the disclosure of which is hereby incorporated herein by reference.

STATEMENT REGARDING FEDERALLY SPONSORED RESEARCH OR DEVELOPMENT

This invention was made with Government support under W15P7T-10-C-B025 awarded by the US Army. The Government has certain rights in the invention.

BACKGROUND

A physics package for a chip-scale atomic clock can include a laser, waveplate, vapor cell, and a photodetector along with other associated electronics. These components can be housed within a body that can be hermetically seal to create a vacuum within the body.

SUMMARY

In an example, a chip-scale atomic clock (CSAC) physics package is provided. This CSAC physics package includes a body defining a cavity, and a first scaffold mounted in the cavity. A laser is mounted on the first surface of the first scaffold. A second scaffold is also mounted in the cavity. The second scaffold is disposed such that the first surface of the second scaffold is facing the first scaffold. A first photodetector is mounted on the first surface of the second scaffold. A vapor cell is mounted on the first surface of the second scaffold. A waveplate is also included, wherein the laser, waveplate, first photodetector, and vapor cell are disposed such that a beam from the laser can propagate through the waveplate and the vapor cell and be detected by the first photodetector. A lid is also included for covering the cavity.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
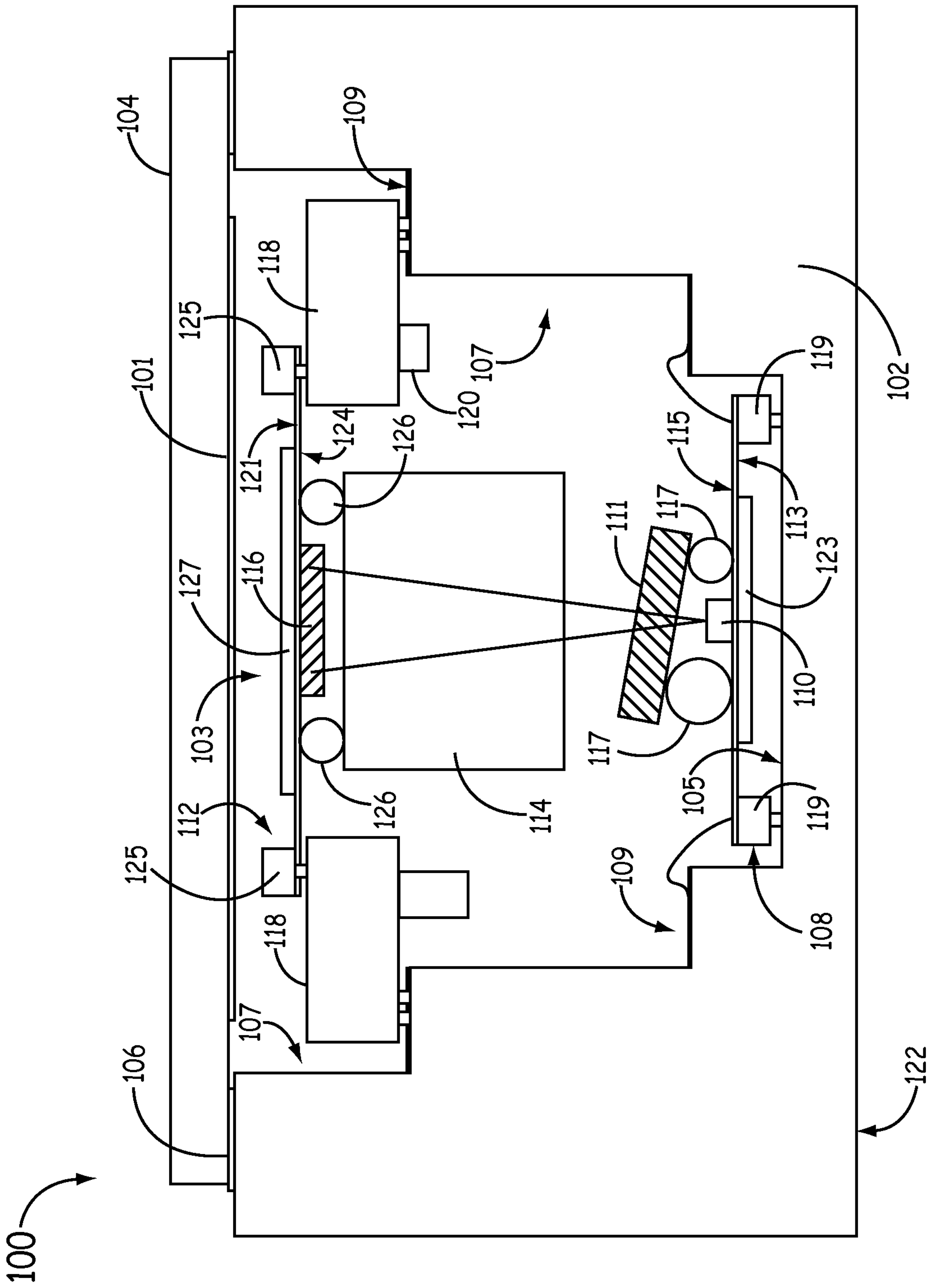
FIG. 1 is a cross-sectional view of an example of a vapor cell atomic clock physics package.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

FIG. 1 is a cross-sectional view of an example physics package for a chip-scale atomic clock (CSAC) physics package 100. The CSAC physics package 100 can include a ceramic body 102 defining a cavity 103 for housing components of the CSAC physics package 100. The ceramic body 102 including the components in the cavity 103 can comprise a ceramic leadless chip carrier (CLCC) package. The CSAC physics package 100 can also include a non-magnetic (e.g., ceramic) lid 104 configured to fit over the cavity 103 of the ceramic body 102 to form a closed package encasing the cavity 103 and the components therein. In an example, the ceramic lid 104 has a generally planar shape. A solder seal 106 can be used to seal the lid 104 to the body 102. In an example, the lid 104 can be sealed to the body 102 in a vacuum. In an example, die attach and sealing operations for the CSAC physics package 100 (e.g., for sealing the lid 104 to the body 102) are accomplished without the use of flux to enable low pressure in the sealed package which can enable lower power operation. This physics package can enable batch vacuum sealing of the lid 104 to the body 102. The CSAC physics package 100 can also include a getter film 101 coating most of the interior surface of a ceramic lid 104.

In an example, the ceramic body 102 has one side (e.g., the top) open such that the body 102 defines the cavity 103. The lid 104 can cover the open side of the body 102 to enclose the cavity 103. In an example, the cavity 103 has a shape generally pentagonal cross section when viewed from the open side (e.g., top). In another example, the cavity 103 has a generally circular cross-section when viewed from the open side (e.g., top). In any case, the cavity 103 can include a base surface 105 and one or more interior sides 107. The one or more sides 107 can have one or more steps 109 defined therein for, for example, supporting structures within the cavity of the body 102.

The CSAC physics package 100 can include one or more scaffolds 108, 112 for supporting components such as a laser 110, waveplate 111, vapor cell 114, and photodetector 116. In an example, a scaffold 108, 112 can include a membrane suspended within a frame. The scaffolds 108, 112 can also include a stiffening member attached to the membrane to provide additional structure for the membrane. To produce the scaffolds 108, 112 at a size that can be used for the CSAC physics package 100, the scaffolds 108, 112 can be fabricated using semiconductor fabrication processes. Accordingly, the frame and stiffening member can be composed of silicon and the membrane can be composed of polyimide. The polyimide can thermally isolate the stiffening member and components on the scaffolds 108, 112 from the frame and body 102.

The CSAC physics package 100 includes a lower scaffold 108 and an upper scaffold 112 that are mounted in the cavity 103. In an example, the lower scaffold 108 and the upper scaffold 112 can be disposed parallel to one another and parallel to the base surface 105 of the cavity 103. In this example, the lower scaffold 108 is attached to the base surface 105 of the cavity 103 via a fluxless die attach. In an example, the fluxless die attach can be a plurality of gold (Au) stud bumps. The lower scaffold 108 can function as a support structure for a heater, the laser 110, and the waveplate 111. The lower scaffold 108 and components thereon (e.g., laser 110, waveplate 111) can be electrically coupled to pins on the body 102 via wire bonds to a pad on a lower step 109 of the inner side surface 107 of the cavity 103 of the ceramic body 102.

The lower scaffold 108 can include a first side 113 that opposes the base surface 105 and a second side 115 that is reverse of the first side 113 and facing the lid 104 and the upper scaffold 112. In an example, the frame 119 and the stiffening member 123 are on the first side 113. The stiffening member 123 can define a plurality of apertures to reduce the mass thereof. In an example, the laser 110 and the waveplate 111 are mounted to the second side 115. Moreover, the waveplate 111 can be disposed overtop of the laser 110 such that a beam of the laser 110 propagates through the waveplate 111. In an example, the laser 110 can be solder bonded to the second side 115 using, for example, flip-chip mounting. Additionally, a plurality of solder balls 117 can be attached to the second side 115. The plurality of solder balls 117 can be disposed around the laser 110 and project a height above the second side 115 that is higher than the laser 110 such that the waveplate 111 can be soldered to the plurality of solder balls 117 and disposed overtop of the laser 110. In an example, the plurality of solder balls 117 can be formed using a jetting process tuned to produce solder balls of the desired size. In an example, the solder balls 117 can be formed of a solder having a high temperature melting point, such that, once formed on the scaffold 108, the solder balls 117 generally maintain their structure during further fabrication of the CSAC physics package 100.

In an example, a first portion of the solder balls 117 on the second side 115 have a lower height above the second side 115 than a second portion of the solder balls 117. Moreover, the first portion of solder balls 117 can be disposed to attach about a first edge of the waveplate 111 and a second portion of the solder balls 117 can be disposed to attach about a second edge of the waveplate 111. The differing height of the first and second portions of the solder balls 117 can cause the waveplate 111 to be disposed at an angle with respect to the second side 115. Orienting the waveplate 111 at an angle can direct laser reflections off of the waveplate 111 away from the laser 110. In an example, the laser 110 can be a vertical cavity surface emitting laser (VCSEL). In an example, the waveplate 111 can be a quarter waveplate.

In an example, the upper scaffold 112 can function as a support structure for an alkali vapor cell 114 and a photodetector 116. The upper scaffold 112 can be supported on an upper step 109 (e.g., an upper shelf) of the inner side surface 107 of the cavity 103 of the ceramic body 102. Moreover, by forming steps 109 in the sides 107 of the cavity 103, the body 102 can be used to, at least partially, space the upper scaffold 112 from the lower scaffold 108. In an example, the upper scaffold 112 can be attached to one or more spacers 118 (e.g., leg structures, washer) extending up from the upper step 109 of the cavity 103 to further space the upper scaffold 112 from the lower scaffold 108. In an example, the spacer 118 can be composed of ceramic. In an example, the spacer 118 can have a ring shape (e.g., a pentagon ring shape) defining an aperture therein. The spacer 118 can be disposed around the vapor cell 114 such that the vapor cell 114 is within the aperture defined in the spacer 118.

In an example, the spacer 118 can function to reduce fatigue on the joint(s) coupling the upper scaffold 112 to the upper step 109. The spacer 118 can reduce fatigue by being composed of a material that has a thermal expansion coefficient that is in between the thermal expansion coefficient of the body 102 and the thermal expansion coefficient of the upper scaffold 112. Accordingly, as the body 102 and the upper scaffold 112 expand and contract due to temperature changes, the spacer 118 can absorb some of the changes. For example, the body 102 can be composed of a ceramic having a thermal expansion coefficient of 7 ppm per degree Celsius, the spacer 118 can have a thermal expansion coefficient of 5 ppm per degree Celsius, and the upper scaffold 112 can have a thermal expansion coefficient of 3 ppm per degree Celsius. In another example, the spacer 118 can be formed of the same material as the body 102 and the lid 104. The spacer 118 can provide mechanical support and electrical contact for the upper scaffold 112. In some examples, the spacer 118 can also provide mechanical support and electrical contact for additional electronic components such as surface mount technology (SMT) electronics 120.

The combination of the upper scaffold 112 and the ceramic spacer 118 can traverse the cavity 103 of the body 102 and attach to the upper step 109. In an example, the upper scaffold 112 can be attached to the spacer 118 via fluxless die attach. The spacer 118 can be attached via fluxless die attach to the body 102, for example, at the upper step 109 of the body 102. In an example, the fluxless die attach can be a plurality of gold (Au) stud bumps.

The upper scaffold 112 can include a first side 121 that opposes the lid 104 and a second side 124 that is reverse of the first side 121 and facing the lower scaffold 108. In an example, the frame 125 and the stiffening member 127 are on the first side 121. The stiffening member 127 can define a plurality of apertures to reduce the mass thereof. In an example, the photodetector 116 and the vapor cell 114 are mounted to the second side 124. Moreover, the vapor cell 114 can be disposed overtop of the photodetector 116 and aligned with the laser 110 and waveplate 111 such that a beam from the laser 110 propagates through the waveplate 111, then through the vapor cell 114 and can be detected by the photodetector 116. In an example, the photodetector 116 can be solder bonded to the second side 124 using, for example, flip-chip mounting. A plurality of solder balls 126 can be attached to the second side 124. The plurality of solder balls 126 can be disposed around the photodetector 116 and can project a height above the second side 124 that is higher than the photodetector 116 such that the vapor cell 114 can be soldered to the plurality of solder balls 126 and disposed overtop of the photodetector 116. In an example, the vapor cell 114 can be disposed at least 200 micrometers apart from the photodetector 116. This gap can enable flux to be flushed from between the vapor cell 114 and the photodetector 116. In an example, the plurality of solder balls 126 can be formed using a jetting process tuned to produce solder balls of the desired size. In an example, the solder balls 126 can be formed of a solder having a high temperature melting point, such that, once formed on the scaffold 112, the solder balls 126 generally maintain their structure during further fabrication of the CSAC physics package 100. In an example, the vapor cell 114 can be an alkali vapor cell containing rubidium atoms.

In an example, the upper scaffold 112 is in a flipped position with respect to the lower scaffold 108. That is, the frame 119 of the lower scaffold 108 projects in the opposite direction from the frame 125 of the upper scaffold 112. Additionally, the components (e.g., laser 110, waveplate 111, and photodetector 116, vapor cell 114) are on the side of their respective scaffold 108, 112 that is the reverse of the side having the frame 119, 125. Accordingly, in order to mount the scaffolds 108, 112 with the components all within the space between the scaffolds 108, 112, the scaffolds are disposed in a flipped position with respect to one another. Additionally, the components (e.g., the laser 110, waveplate 111, photodetector 116, and vapor cell 114) can be disposed in between the polyimide layers of the scaffolds 108, 112.

The CSAC physics package 100 can include an input/output (I/O) solder pad 122 on a bottom portion of the body 102. Thus, wires can attach to the CSAC physics package 100 on a bottom portion thereof. In an example, interconnects between the I/O solder pad 122 and internal components (e.g., laser 110, waveplate 111, and photodetector 116, vapor cell 114) can be routed through the body 102. In some examples, interconnects for components on the upper scaffold 112 (e.g., photodetector 116) can be routed through the spacer 118. Thus, the spacer 118 can include electrical traces on an internal or outside portion thereof.

In an example, a magnetic coil can be disposed about (e.g., within) the spacer 118 such that the magnetic coil extends around the vapor cell 114. The magnetic coil can be configured to provide a bias field for the vapor cell 114. In an example, the magnetic coil can be integrated into (e.g., internal to) the spacer 118.

Figure 2:
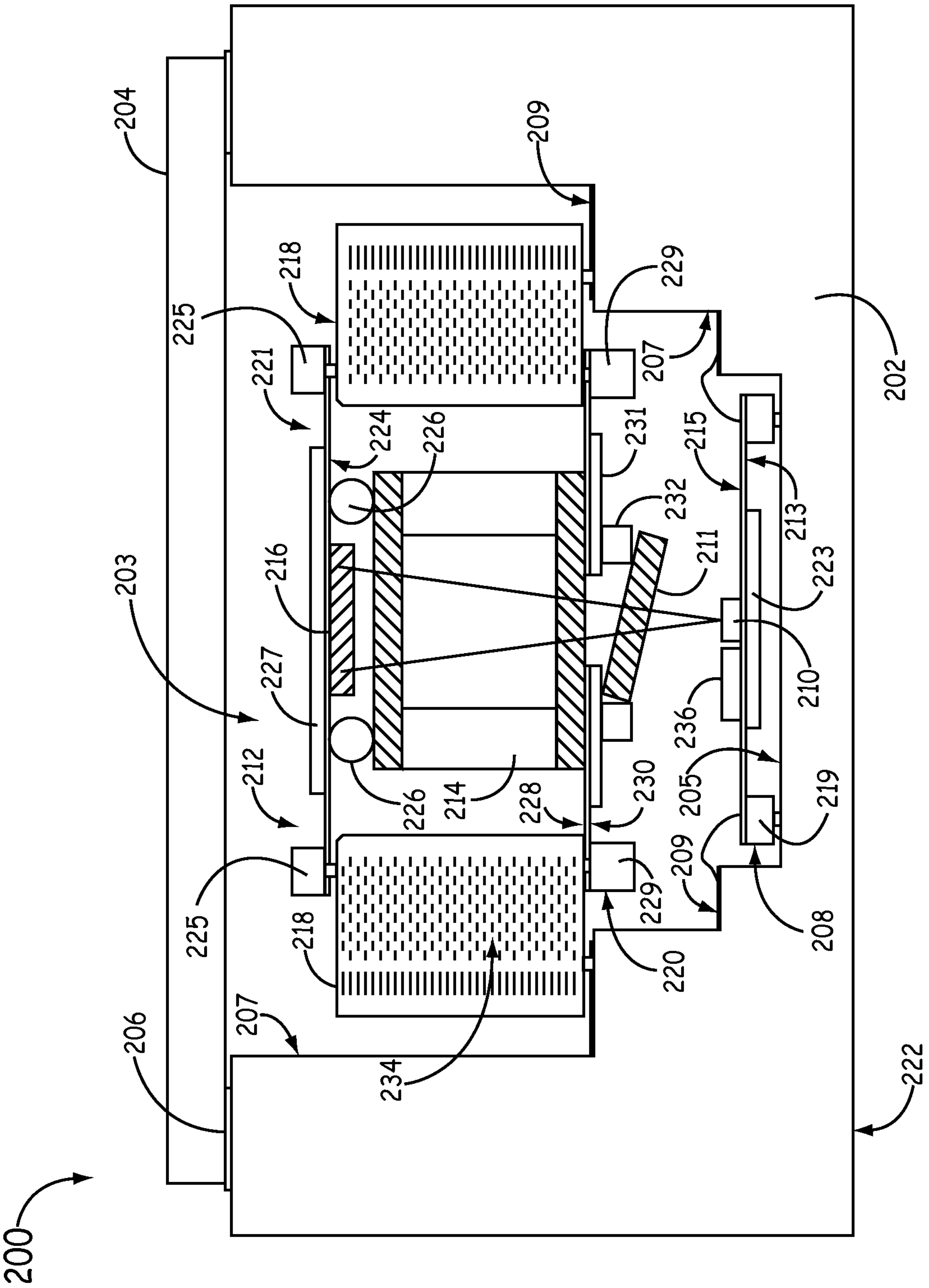
FIG. 2 is a cross-sectional view of another example of a vapor cell atomic clock physics package.

FIG. 2 is a cross-sectional view of another example physics package for a CSAC physics package 200. The CSAC physics package 200 can include a ceramic body 202 defining a cavity 203 for housing components of the CSAC physics package 200. The ceramic body 202 including the components in the cavity 203 can comprise a ceramic leadless chip carrier (CLCC) package. The CSAC physics package 200 can also include a non-magnetic (e.g., ceramic) lid 204 configured to fit over the cavity 203 of the ceramic body 202 to form a closed package encasing the cavity 203 and the components therein. In an example, the ceramic lid 204 has a generally planar shape. A solder seal 206 can be used to seal the lid 204 to the body 202. In an example, die attach and sealing operations for the CSAC physics package 200 (e.g., for sealing the lid 204 to the body 202) are accomplished without the use of flux to enable low pressure in the sealed package which can enable lower power operation. In an example, the lid 204 can be sealed to the body 202 in a vacuum. This physics package can enable batch vacuum sealing of the lid 204 to the body 202. The CSAC physics package 200 can also include a getter film coating most of the interior surface of a ceramic lid 204.

In an example, the ceramic body 202 has one side (e.g., the top) open such that the body 202 defines the cavity 203. The lid 204 can cover the open side of the body 202 to enclose the cavity 203. In an example, the cavity 203 has a shape generally pentagonal cross section when viewed from the open side (e.g., top). In another example, the cavity 203 has a generally circular cross-section when viewed from the open side (e.g., top). In any case, the cavity 203 can include a base surface 205 and one or more interior sides 207. The one or more sides 207 can have one or more steps 209 defined therein for, for example, supporting structures within the cavity of the body 202.

The CSAC physics package 200 can include one or more scaffolds 208, 212, 220 for supporting components such as a laser 210, waveplate 211, vapor cell 214, and photodetector 216. In an example, a scaffold 208, 212, 220 can include a membrane suspended between a frame. The scaffolds 208, 212, 220 can also include a stiffening member attached to the membrane to provide additional structure for the membrane. To produce the scaffolds 208, 212, 220 at a size that can be used for the CSAC physics package 200, the scaffolds 208, 212, 220 can be fabricated using semiconductor fabrication processes. Accordingly, the frame and stiffening member can be composed of silicon and the membrane can be composed of polyimide. The polyimide can thermally isolate the stiffening member and components on the scaffolds 208, 212, 220 from the frame and body 202.

The CSAC physics package 200 includes a lower scaffold 208, an upper scaffold 112, and a middle scaffold 220 that are mounted in the cavity 203. In an example, the lower scaffold 208, the upper scaffold 212, and the middle scaffold 220 can be disposed parallel to one another and parallel to the base surface 205 of the cavity 203. In this example, the lower scaffold 208 is attached to the base surface 205 of the cavity 203 via fluxless die attach. In an example, the fluxless die attach can be a plurality of gold (Au) stud bumps. The lower scaffold 208 can function as a support structure for a heater and the laser 210. The lower scaffold 208 and components thereon (e.g., laser 210) can be electrically coupled to pins on the body 202 via wire bonds to a pad on a lower step 209 of the inner side surface 207 of the cavity 203 of the ceramic body 202. In an example, the laser 210 can be a vertical cavity surface emitting laser (VCSEL).

The lower scaffold 208 can include a first side 213 that opposes the base surface 205 and a second side 215 that is reverse of the first side 213 and facing the lid 204, the middle scaffold 220, and the upper scaffold 212. In an example, the frame 219 and the stiffening member 223 are on the first side 213. The stiffening member 223 can define a plurality of apertures to reduce the mass thereof. In an example, the laser 210 is mounted to the second side 215. In an example, the laser 210 can be solder bonded to the second side 215 using, for example, flip-chip mounting.

Figure 3:
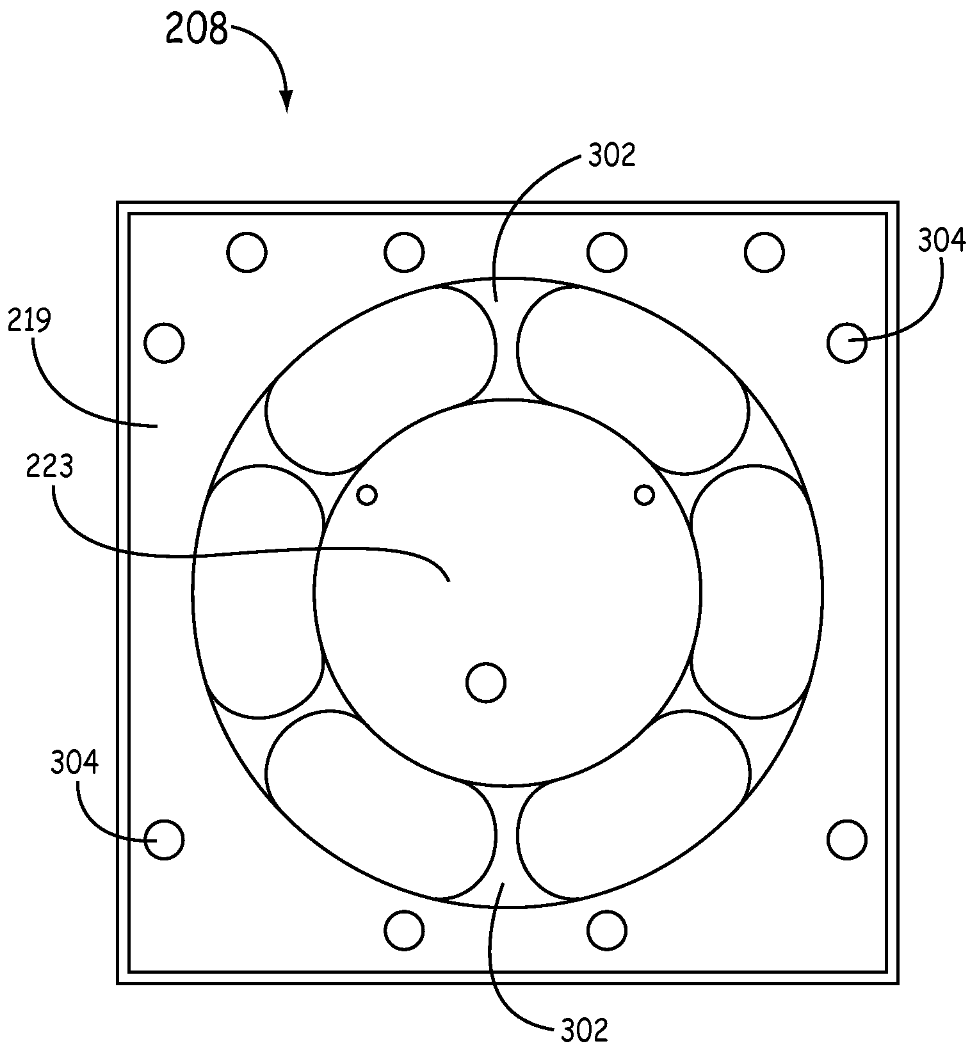
FIG. 3 is a bottom view of an example lower scaffold of the vapor cell atomic clock physics package of FIG. 2.

FIG. 3 is a bottom view of an example lower scaffold 208. As mentioned above, the lower scaffold 208 can include a membrane having a frame 219 and a stiffening member 223 attached thereto. The frame 219 and the stiffening member 223 can be separated from one another on the membrane with a plurality of tethers 302 of the membrane extending between the frame 219 and the stiffening member 223. A plurality of stud bumps 304 can be on the frame 219 to attach the frame 219 to the body 202. Components (e.g., the laser 210) can be mounted on the membrane in the area of the stiffening member 223. Traces can extend across the tethers 302 to electrically couple the components on the stiffening member to the stud bumps 304.

The upper scaffold 212 and middle scaffold 220 can be mounted on opposite sides of one or more spacers 218 (e.g., leg structure, washer). The upper scaffold 212 can function as a support structure for the photodetector 216 and the middle scaffold 220 can function as a support structure for the waveplate 211. In addition, the upper scaffold 212 and middle scaffold 220 can function as a support structure for the alkali vapor cell 214. In particular, the vapor cell 214 can be supported between the upper scaffold 212 and the middle scaffold 220. Accordingly, the vapor cell 214 attached to the upper scaffold 212 on one end and the middle scaffold 220 on the opposite end. Moreover, the vapor cell 214 can be disposed within an aperture of the spacer 218. Accordingly, the upper scaffold 212, middle scaffold 220, and the spacer 218 can form a support structure for the vapor cell 214. In an example, a heater for the upper surface of the vapor cell 214 can be mounted on the upper scaffold 212 and a heater for the lower surface of the vapor cell 214 can be mounted on the middle scaffold 220. In another example, one or more heaters can be fabricated on one or more surfaces of the vapor cell 214. In an example, the spacer 218 can have a ring shape (e.g., a pentagon ring shape) defining an aperture therein. The spacer 218 can be disposed around the vapor cell 214 such that the vapor cell 214 is within the aperture defined in the spacer 218.

In an example, the spacer 218 can also function to reduce fatigue on the joint(s) coupling the upper scaffold 212 and the middle scaffold 220 to the upper step 209. The spacer 218 can reduce fatigue by being composed of a material that has a thermal expansion coefficient that is in between the thermal expansion coefficient of the body 202 and the thermal expansion coefficient of the upper scaffold 212 and middle scaffold 220. Accordingly, as the body 202, the upper scaffold 212, and the middle scaffold 220 expand and contract due to temperature changes, the spacer 218 can absorb some of the changes. For example, the body 202 can be composed of a ceramic having a thermal expansion coefficient of 7 ppm per degree Celsius, the spacer 218 can have a thermal expansion coefficient of 5 ppm per degree Celsius, and the upper scaffold 212 and middle scaffold 220 can have a thermal expansion coefficient of 3 ppm per degree Celsius. In another example, the spacer 218 can be formed of the same material as the body 202 and the lid 204. The spacer 218 can provide mechanical support and electrical contact for the upper scaffold 212 and middle scaffold 220. In some examples, the spacer 218 can also provide mechanical support and electrical contact for additional electronic components such as surface mount technology (SMT) electronics.

As mentioned above, the spacer 218 with the upper scaffold 212 and middle scaffold 220 mounted thereon can be mounted to a step 209 in the body 202. In particular, the spacer 218 can be mounted to an upper step 209. Steps 209 in the sides 209 of the cavity 203 can be used to, at least partially, space the upper scaffold 212 and middle scaffold 220 from the lower scaffold 208. The spacer 218 can extend up from the upper step 209 of the cavity 203 to further space the upper scaffold 212 from the lower scaffold 208 and middle scaffold 220 and provide space for the vapor cell 214 between the middle scaffold 220 and the upper scaffold 214. In an example, the spacer 218 can be composed of ceramic.

The combination of the upper scaffold 212 and the ceramic spacer 218 can traverse the cavity 203 of the body 202 on a top portion of the spacer 218. Likewise, the middle scaffold 220 and the ceramic spacer 218 can traverse the cavity 203 of the body 202 on a bottom portion of the spacer 218. In an example, the upper scaffold 212 and the middle scaffold 220 can be attached to the spacer 218 via fluxless die attach. The spacer 218 can be attached via fluxless die attach to the upper step 209 of the body 202. In an example, the fluxless die attach can be a plurality of gold (Au) stud bumps.

The upper scaffold 212 can include a first side 221 that opposes the lid 204 and a second side 224 that is reverse of the first side 221 and facing the middle scaffold 220 and the lower scaffold 208. In an example, the frame 225 and the stiffening member 227 are on the first side 221. The stiffening member 227 can define a plurality of apertures to reduce the mass thereof. In an example, the photodetector 216 and the vapor cell 214 are mounted to the second side 224. Moreover, the vapor cell 214 can be disposed overtop of the photodetector 216 and aligned with the laser 210 and waveplate 211 such that a beam from the laser 210 propagates through the waveplate 211, then through the vapor cell 214 and can be detected by the photodetector 216. In an example, the photodetector 216 can be solder bonded to the second side 224 using, for example, flip-chip mounting. A plurality of solder balls 226 can be attached to the second side 224. The plurality of solder balls 226 can be disposed around the photodetector 216 and can project a height above the second side 224 that is higher than the photodetector 216 such that the vapor cell 214 can be soldered to the plurality of solder balls 224 and disposed overtop of the photodetector 216. In an example, the vapor cell 214 can be disposed at least 200 micrometers apart from the photodetector 216. This gap can enable flux to be flushed from between the vapor cell 214 and the photodetector 216. In an example, the plurality of solder balls 226 can be formed using a jetting process tuned to produce solder balls of the desired size. In an example, the solder balls 226 can be formed of a solder having a high temperature melting point, such that, once formed on the scaffold 212, the solder balls 224 generally maintain their structure during further fabrication of the CSAC physics package 200. In an example, the vapor cell 214 can be an alkali vapor cell containing rubidium atoms.

In an example, the upper scaffold 212 is in a flipped position with respect to the lower scaffold 208 and the middle scaffold 220. That is, the frame 219 on the lower scaffold 208 and the middle scaffold 220 project in the opposite direction from the frame 225 of the upper scaffold 212. Additionally, the vapor cell 214 can be disposed in between the polyimide layers of the upper scaffold 212 and middle scaffold 220.

Figure 4:
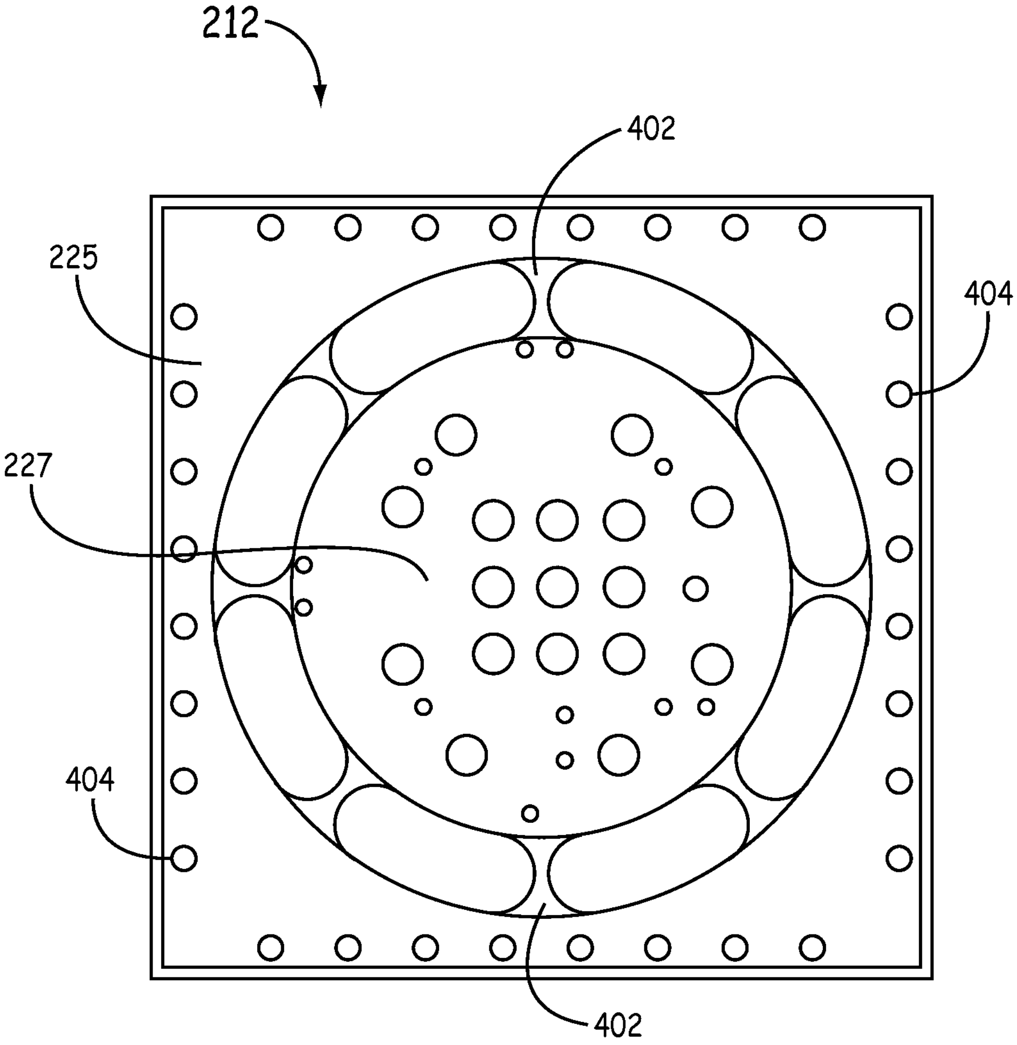
FIG. 4 is a top view of an example upper scaffold of the vapor cell atomic clock physics package of FIG. 2.

FIG. 4 is a top view of an example upper scaffold 212. As mentioned above, the upper scaffold 212 can include a membrane having a frame 225 and a stiffening member 227 attached thereto. The frame 225 and the stiffening member 227 can be separated from one another on the membrane with a plurality of tethers 402 of the membrane extending between the frame 225 and the stiffening member 227. A plurality of stud bumps 404 can be on the frame 225 to attach the frame 225 to the body 202. Components (e.g., the vapor cell 214) can be mounted on the membrane in the area of the stiffening member 227. Traces can extend across the tethers 402 to electrically couple the components on the stiffening member to the stud bumps 404.

The middle scaffold 220 can include a first side 228 that faces the lid 204 and opposes the upper scaffold 212 and a second side 230 that faces the base surface 205 and opposes the lower scaffold 208. The middle scaffold 220 can be mounted to the spacer 218 on the first side 228 of the scaffold 220.

In an example, the frame 229 and the stiffening member 231 are on the second side 230. The stiffening member 231 can define a plurality of apertures to reduce the mass thereof. The vapor cell 214 can also be mounted on the first side 228 of the middle scaffold 220. The waveplate 211 can be mounted on the second side 230 of the middle scaffold 220. In an example, a plurality of tilting features 232 can be fabricated into the second side 230 of the middle scaffold 220. The waveplate 211 can be mounted to these tilting features 232, which can be configured to orient the waveplate 211 at an angle with respect to the middle scaffold 220. For example, a first feature can have a lower height than a second feature, and a first edge of the waveplate 211 can be attached to the first feature and a second edge of the waveplate 211 can be attached to the second feature. Orienting the waveplate 211 at an angle can direct laser reflections off of the waveplate 211 away from the laser 210. In an example, the waveplate 211 can be a quarter waveplate.

Figure 5:
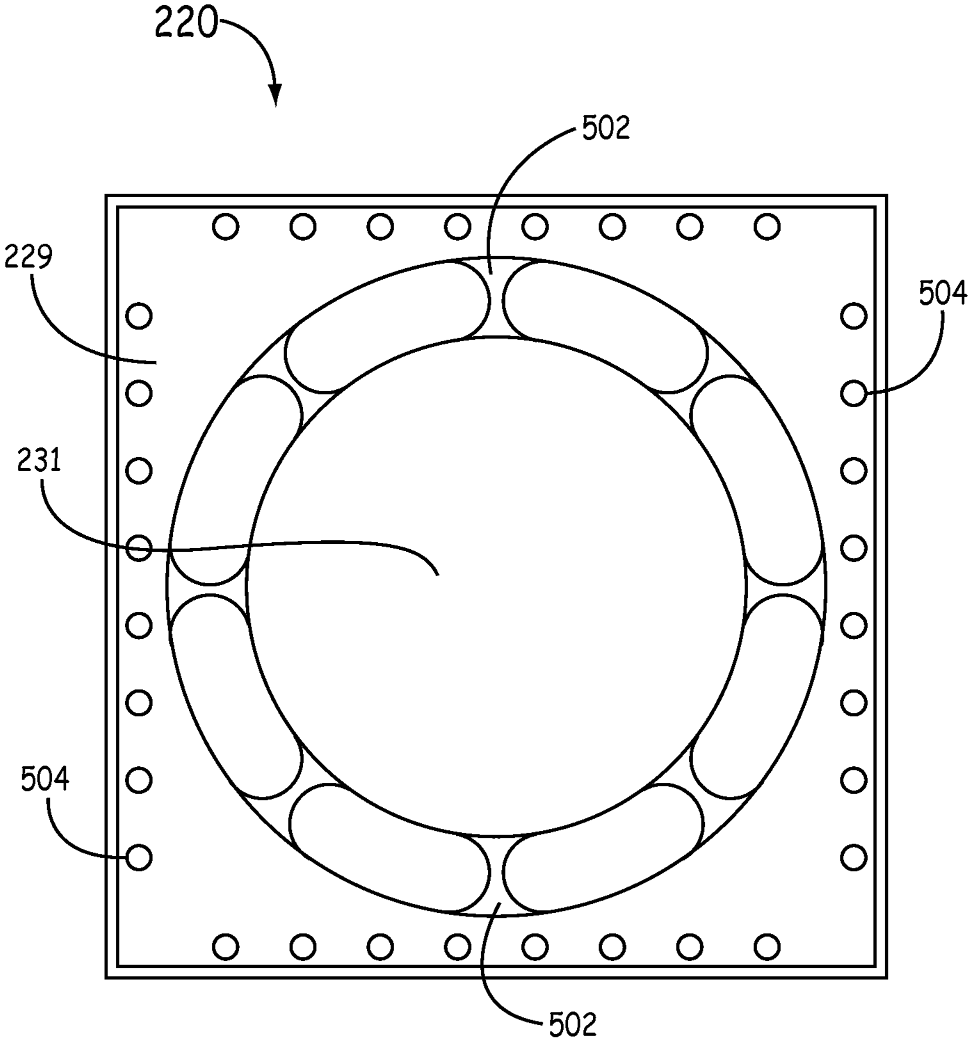
FIG. 5 is a bottom view of an example middle scaffold of the vapor cell atomic clock physics package of FIG. 2.

FIG. 5 is a bottom view of an example middle scaffold 220. As mentioned above, the middle scaffold 220 can include a membrane having a frame 229 and a stiffening member 231 attached thereto. The frame 229 and the stiffening member 231 can be separated from one another on the membrane with a plurality of tethers 502 of the membrane extending between the frame 229 and the stiffening member 231. A plurality of stud bumps 504 can be on the frame 229 to attach the frame 229 to the body 202. Components (e.g., the vapor cell 214) can be mounted on the membrane in the area of the stiffening member 223. Additionally, other components (e.g., the waveplate 211) can be mounted on the stiffening member 231.

In an example, a magnetic coil 234 can be disposed about (e.g., within) the spacer 218 such that the magnetic coil extends around the vapor cell 214. The magnetic coil can be configured to provide a bias field for the vapor cell 214. In an example, the magnetic coil 234 can be integrated into (e.g., internal to) the spacer 218.

In an example, a second photodetector 236 can be configured to detect reflections of the laser 210 from the waveplate 211. The second photodetector 236 can be used to control the light power output of the laser 210. In particular, based on the strength of the light reflected from the waveplate 211, the power output of the laser 210 can be determined and controlled accordingly. The second photodetector 236 can be mounted to the lower scaffold 208. In particular, the second photodetector 236 can be mounted to the second side 215 of the lower scaffold 208 adjacent the laser 210.

The CSAC physics package 200 can include an input/output (I/O) solder pad 222 on a bottom portion of the body 202. Thus, a bottom portion of the CSAC physics package 200 can be attached to a circuit board. In an example, interconnects between the I/O solder pad and internal components (e.g., laser 210, waveplate 211, and photodetector 216, vapor cell 214) can be routed through the body 202. In some examples, interconnects for components on the upper scaffold 212 (e.g., photodetector 216) and middle scaffold 220 (e.g., heater) can be routed through the spacer 218. Thus, the spacer 218 can include electrical traces on an internal or outside portion thereof.

In an example, to manufacture the CSAC physics package 100 or CSAC physics package 200, the scaffolds, spacer, body, and lid can be formed and combined together. The scaffolds can be created and assembled at the wafer level. For example, a scaffold can comprise a silicon wafer having a polyimide membrane on a first side thereof. The side of the scaffold having the polyimide member can be referred to as the "front side" of the scaffold. The front side of the scaffold can then be etched to form the frame and stiffening member having holes therein. As mentioned above, adding the polyimide membrane and etching the scaffold can occur on wafer having a plurality of un-diced scaffold dies thereon.

Once etched, components can be attached to the scaffold. For the lower scaffold 108 of the CSAC physics package 100, the etched wafer can have the heater, laser 110, and waveplate 111 attached thereto. The laser 110 and heater can be, for example, flip-chip mounted to the lower scaffold 108. The plurality of solder balls 117 can be attached using the jetting process mentioned above. Then, the waveplate 111 can be attached to the solder balls 117 using a solder, an epoxy, or other die attach compound. For the upper scaffold 112, the etched wafer can have the photodetector 116 attached thereto, along with the solder balls 126, and then the vapor cell 114. The photodetector 116 can be flip-chip mounted, and the vapor cell 114 can be attached using a solder, an epoxy, or other die attach compound. In an example, the photodetector 116 can be electrically coupled to the upper scaffold 112 with a wirebond.

For the lower scaffold 208 of the CSAC physics package 200, the etched wafer can have the laser 210 and the second photodetector 236 attached thereto. The laser 210 and second photodetector 236 can be, for example, flip-chip mounted to the lower scaffold 208. For the middle scaffold 220, the plurality of features 232 can be fabricated therein using standard semiconductor processes. The waveplate 211 can then be attached to the scaffold 220 (e.g., to the plurality of features 232) using, for example, an epoxy. For the upper scaffold 212, the etched wafer can have the photodetector 216 attached thereto, along with the solder balls 226, and then the vapor cell 214. The photodetector 216 can be flip-chip mounted, and the vapor cell 214 can be attached using a solder, an epoxy, or other die attach compound. In an example, the photodetector 216 can be electrically coupled to the upper scaffold 212 with a wirebond.

These components can be added before singulation of the wafers. The wafers can then be singulated to form the individual scaffolds. In an example, the wafers can be singulated using a dry dicing process. The scaffolds can then have solder balls attached for electrical and mechanical attachment of the scaffolds. In an example, after the scaffolds have been fabricated they can be tested and have operational burn-in performed.

The lower scaffold 108 of the CSAC physics package 100 can be attached to the base surface 105 (e.g., bottom, floor) of the body 102 using fluxless die attach (e.g., gold (Au) stud bumps). Wirebonds for the lower scaffold 108 can be attached to the appropriate pads on the body 102 at, for example, the lower step 109. The upper scaffold 112 can be attached to spacer 118 or directly to the body 102 using solder, gold (Au) stud bumps, or other fluxless die attach compounds.

The SMT electronics 120 can be attached to the spacer 118. The spacer 118 can be manufactured in array form suitable for batch die/component attach, and singulated to separate. The spacer 118 can be singulated, the upper scaffold 112 can be attached, and the combination can be attached to the upper step 109 in the body 102 using fluxless die attach (e.g., gold (Au) stud bumps). In an example, this die attach can provide both mechanical and electrical feedthru. In another example, this die attach can provide mechanical die attach with no electrical feedthru and the electrical attach can be done with wirebonds.

The lower scaffold 208 of the CSAC physics package 200 can be attached to the base surface 205 (e.g., bottom, floor) of the body 202 using fluxless die attach (e.g., gold (Au) stud bumps). Wirebonds for the lower scaffold 208 can be attached to the appropriate pads on the body 202 at, for example, the lower step 209.

The spacer 218 can be manufactured in array form suitable for batch die/component attach, and singulated to separate. Once singulated, the upper scaffold 212 and the middle scaffold 220 can be attached to opposite ends of the spacer 218. The vapor cell 214 can be positioned in between the upper scaffold 212 and the middle scaffold 220 in an aperture formed by the spacer 118. The vapor cell 214 can be attached to the middle scaffold 220 and/or the upper scaffold 212 if not already attached. The upper scaffold 212 and middle scaffold 220 can be attached to spacer 218 using solder, gold (Au) stud bumps, or other fluxless die attach compounds. The combined construction of the spacer 218, upper scaffold 212, middle scaffold 220 and vapor cell 214 can then be mounted to a step 209 (e.g., the upper step) of the body 202. The spacer 218 can be attached to step 209 using solder, gold (Au) stud bumps, or other fluxless die attach compounds. In an example, this die attach can provide both mechanical and electrical feedthru. In another example, this die attach can provide mechanical die attach with no electrical feedthru and the electrical attach can be done with wirebonds.

The lid 204 can be coated with appropriate material (e.g., titanium, etc.) for a getter. In an example, the lid 204 can be coated by sputter depositing the material for the getter. After activating the getter in vacuum, the lid 204 can be sealed to the body 202 with solder.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A chip-scale atomic clock physics package comprising:

a body defining a cavity;

a first scaffold, composed of silicon, mounted in the cavity, the first scaffold having a first surface and a second surface;

a laser mounted on the first surface of the first scaffold;

a second scaffold mounted in the cavity, the second scaffold having a first surface and a second surface, the second scaffold disposed such that the first surface of the second scaffold is facing the first surface of the first scaffold;

a first photodetector mounted on the first surface of the second scaffold;

a vapor cell mounted on the first surface of the second scaffold;

a waveplate, wherein the laser, waveplate, first photodetector, and vapor cell are disposed such that a beam from the laser can propagate through the waveplate and the vapor cell and be detected by the first photodetector; and a lid covering the cavity.

2. The chip-scale atomic clock physics package of claim 1, wherein the first scaffold is attached to a base surface of the cavity.

3. The chip-scale atomic clock physics package of claim 1, wherein the waveplate is disposed overtop of the laser and mounted on the first surface of the first scaffold, wherein the laser is attached to the first surface with a solder bond, and wherein the waveplate is attached to the first surface using a plurality of high temperature solder balls, the plurality of high temperature solder balls disposed around the laser and configured such that the waveplate is at an angle with respect to the first surface.

4. The chip-scale atomic clock physics package of claim 1, wherein the vapor cell is disposed overtop of the first photodetector on the first surface of the second scaffold.

5. The chip-scale atomic clock physics package of claim 4, wherein the first photodetector is attached to the first surface of the second scaffold, and wherein the vapor cell is attached to the first surface using a plurality of high temperature solder balls, the plurality of high temperature solder balls disposed around the first photodetector and having a height taller than the first photodetector.

6. The chip-scale atomic clock physics package of claim 1, wherein the cavity includes a step surface, the physics package comprising:

one or more spacers attached to the step surface, wherein the one or more spacers are attached to opposing sides of the cavity, wherein the second scaffold is attached to the one or more spacers and spans across the cavity.

7. The chip-scale atomic clock physics package of claim 6, wherein the one or more spacers have a general ring shape.

8. The chip-scale atomic clock physics package of claim 6, wherein the one or more spacers has a thermal expansion coefficient that is in between that of the body and the second scaffold.

9. The chip-scale atomic clock physics package of claim 8, wherein the body and lid are composed of a first ceramic and the one or more spacers are composed of a second ceramic.

10. The chip-scale atomic clock physics package of claim 6, comprising:

a magnetic coil about the one or more spacers.

11. The chip-scale atomic clock physics package of claim 6, wherein the one or more spacers comprise a first surface facing the lid and a second surface facing a base surface of the cavity, wherein the second scaffold is mounted to the first surface of the one or more spacers and wherein the second surface is mounted to the step surface of the cavity; and a third scaffold mounted to the second surface of the one or more spacers, wherein the vapor cell is attached to the third scaffold.

12. The chip-scale atomic clock physics package of claim 11, wherein the waveplate is mounted to the third scaffold.

13. The chip-scale atomic clock physics package of claim 12, wherein the third scaffold includes a first surface opposing the first surface of the second scaffold and a second surface opposing a first surface of the first scaffold, wherein the vapor cell is mounted to the first surface of the third scaffold and the waveplate is mounted to the second surface of the third scaffold.

14. The chip-scale atomic clock physics package of claim 13, comprising:

a plurality of features configured to support the waveplate at an angle with respect to the second surface of the third scaffold.

15. The chip-scale atomic clock physics package of claim 14, comprising:

a second photodetector mounted on the first surface of the first scaffold adjacent the laser, wherein the second photodetector is configured to sense reflections from the laser off of the waveplate.

16. The chip-scale atomic clock physics package of claim 1, comprising:

a getter film on an inner surface of the lid.

17. A method of fabricating a chip-scale atomic clock physics package, the method comprising:

forming a body defining a cavity, wherein the cavity defines at least one step;

fabricating a first scaffold;

attaching a laser to a first surface of the first scaffold;

attaching the first scaffold to the body within the cavity;

form a support structure having a first mounting surface and a second mounting surface;

fabricating a second scaffold;

attaching a photodetector to a first surface of the second scaffold;

attaching a vapor cell to the first surface of the second scaffold;

attaching the second scaffold to first mounting surface of the support structure;

fabricating a third scaffold;

attaching a waveplate to a first surface of the third scaffold;

attaching the third scaffold to the second mounting surface of the support structure and attaching the third scaffold to the vapor cell;

attaching the support structure to the at least one step of the cavity;

coating a lid with a getter; and sealing the lid to the body such that the getter is within the cavity.

18. The method of claim 17, wherein attaching the first scaffold to the body includes attaching the first scaffold to a base surface of the body.

19. The method of claim 17, wherein attaching the laser to the first surface of the first scaffold includes solder bonding the laser to the first surface of the first scaffold;

wherein attaching the photodetector to the first surface of the second scaffold includes solder bonding the photodetector to the first surface of the second scaffold;

wherein the method includes attaching a plurality of high temperature solder balls to the first surface of the second scaffold, the plurality of high temperature solder bonds disposed around the photodetector;

wherein attaching the vapor cell to the first surface of the second scaffold includes soldering to the vapor cell to the plurality of high temperature solder balls; and wherein forming the support structure includes forming a magnetic coil about the support structure.

20. A chip-scale atomic clock physics package comprising:

a ceramic body defining a cavity, the ceramic body defining a first step in a side of the cavity;

a ceramic lid attached to the ceramic body and hermetically sealing the cavity;

a first scaffold attached to a base surface of the cavity;

a laser mounted to the first scaffold;

a ceramic support structure attached to the first step, the ceramic support structure having a first surface facing the lid and a second surface facing the base surface;

a second scaffold attached to the first surface of the support structure;

a photodetector mounted to a first surface of the second scaffold;

a vapor cell mounted to the first surface of the second scaffold, the vapor cell disposed overtop of the photodetector;

a third scaffold attached to the second surface of the support structure, wherein the vapor cell is mounted to the third scaffold, such that the vapor cell is disposed between the second scaffold, third scaffold, and within an aperture formed by the ceramic support structure; and a waveplate mounted to the third scaffold, wherein the laser, waveplate, photodetector, and vapor cell are disposed such that a beam from the laser can propagate through the waveplate and the vapor cell and be detected by the photodetector.

* * * * *